(12) United States Patent
Kang

(10) Patent No.: US 8,773,892 B2
(45) Date of Patent: Jul. 8, 2014

(54) METHOD AND APPARATUS MANAGING WORN CELLS IN RESISTIVE MEMORIES

(71) Applicant: Samsung Electronics Co., Ltd., Suwon-si (KR)

(72) Inventor: Yong-Hoon Kang, Seoul (KR)

(73) Assignee: Samsung Electronics Co., Ltd., Suwon-si, Gyeonngi-do (KR)

( * ) Notice: Subject to any disclaimer, the term of this patent is extended or adjusted under 35 U.S.C. 154(b) by 0 days.

(21) Appl. No.: 14/108,441

(22) Filed: Dec. 17, 2013

(65) Prior Publication Data

US 2014/0104929 A1    Apr. 17, 2014

Related U.S. Application Data

(63) Continuation of application No. 13/053,337, filed on Mar. 22, 2011, now Pat. No. 8,634,225.

(30) Foreign Application Priority Data

Mar. 24, 2010   (KR) .................. 10-2010-0026404

(51) Int. Cl.
 *G11C 11/24* (2006.01)
(52) U.S. Cl.
 USPC .................... 365/148; 365/189.07; 365/210.1
(58) Field of Classification Search
 CPC ........... G11C 11/5642; G11C 16/3495; G11C 2211/5634; G11C 13/004
 USPC .................. 365/148, 189.07, 210.1
 See application file for complete search history.

(56) References Cited

U.S. PATENT DOCUMENTS

| | | |
|---|---|---|
| 6,194,738 B1 | 2/2001 | Debenham et al. |
| 2004/0246798 A1* | 12/2004 | Guterman et al. ............ 365/202 |
| 2008/0130364 A1* | 6/2008 | Guterman et al. ....... 365/185.09 |
| 2009/0003046 A1 | 1/2009 | Nirschi et al. |
| 2009/0034343 A1 | 2/2009 | Nirschi et al. |
| 2009/0073760 A1 | 3/2009 | Betse et al. |
| 2011/0131367 A1 | 6/2011 | Park et al. |

FOREIGN PATENT DOCUMENTS

| | | |
|---|---|---|
| JP | 2003338199 A | 11/2003 |
| KR | 1020040049293 A | 6/2004 |

* cited by examiner

*Primary Examiner* — Tuan T Nguyen
(74) *Attorney, Agent, or Firm* — Volentine & Whitt, PLLC

(57) ABSTRACT

A method and apparatus for management worn resistive memory cells are presented. A normal read mode or worn memory cell detecting mode are used depending on the wear state of a resistive memory cell. A detection reference point is changed upon wear indication to detect the resistance of the resistive memory cell. The resistance of the resistive memory cell is detected using the changed detection reference point to determine whether or not the resistive memory cell is worn by comparing the detected resistance to a wear reference level.

15 Claims, 14 Drawing Sheets

US 8,773,892 B2

METHOD AND APPARATUS MANAGING WORN CELLS IN RESISTIVE MEMORIES

CROSS-REFERENCE TO RELATED APPLICATION

This is a continuation of application Ser. No. 13/053,337, filed Mar. 22, 2011, which issued as U.S. Pat. No. 8,634,225 on Jan. 21, 2014, and which claims priority under 35 U.S.C. §119 to Korean Patent Application No. 10-2010-0026404 filed Mar. 24, 2010, the subject matter of which is hereby incorporated by reference.

BACKGROUND OF THE INVENTION

The inventive concept relates to semiconductor memory systems, and more particularly to semiconductor memory systems capable of managing worn memory cell(s) within a memory cell array. The inventive concept also relates to methods of operating a memory system.

Many different types of semiconductor memory are currently used to store data within telecommunication, consumer electronic, and household products. Semiconductor memory devices may be categorized as volatile and non-volatile in operative nature. In the absence of applied power data stored in a volatile memory device, such as a dynamic random access memory (DRAM), is lost. In contrast, stored data is retained in a non-volatile memory device even when applied power is interrupted.

Since non-volatile memory devices are generally capable of retaining stored data in the absence of applied power, operating with relatively low power consumption, and storing large quantities of data, they are commonly selected for use as a storage medium within mobile devices. Examples of non-volatile memory devices include a flash memory, a phase change random access memory (PRAM), a ferroelectric RAM (FeRAM), a magnetic RAM (MRAM), a resistive RAM (RRAM), and a spin-transfer torque-based MRAM (STT-RAM).

SUMMARY OF THE INVENTION

Embodiments of the inventive concept effectively provide methods and related apparatuses capable of managing worn resistive memory cells in semiconductor memory system by detecting a change in the resistance of the resistive memory cells.

In one embodiment, the inventive concept provides a method of managing worn memory cells in a resistive memory, the method comprising; switching from a normal read mode to a worn memory cell detecting mode upon detecting a decrease in a resistance of a resistive memory cell, changing a detection reference point used to detect the resistance of the resistive memory cell when switching to the worn memory cell detecting mode, and detecting the resistance of the resistive memory cell using the changed detection reference point to determine whether or not the resistive memory cell is worn by comparing the detected resistance to a wear reference level.

In another embodiment, the inventive concept provides a worn memory cell management apparatus operating in conjunction with a sense amplifier detecting a programmed state for a resistive memory cell using a reference signal, the apparatus comprising; a mode changing unit configured to switch between a normal read mode and a worn memory cell detecting mode and provide a mode change signal, a reference control unit that, upon receiving the mode change signal indicating a switch from the normal read mode to the worn memory cell detecting mode, changes a detection reference point used to detect a resistance of the resistive memory cell and provides an adjusted reference signal to the sense amplifier, and a cell wear determining unit configured to detect the resistance of the resistive memory cell at the changed detection reference point and determine whether the resistive memory cell is worn by comparing the detected resistance of the resistive memory cell to a wear reference level.

In another embodiment, the inventive concept provides a method of operating a memory system having a memory cell array including a resistive memory cell, the method comprising; during a normal read operation executed when the resistive memory cell is not worn, providing a sense amplifier with an input voltage and a reference voltage to detect a programmed state for the resistive memory cell in relation to a detection reference point used to discriminate between adjacent resistance distributions for the resistive memory cell, wherein the input voltage is determined by an applied bias voltage, and during a worn memory cell detecting mode executed to determine whether the resistive memory cell is worn, providing the sense amplifier with at least one of an adjusted reference voltage and an adjusted input voltage to change the detection reference point and determine whether resistance for the resistive memory cell has decreased.

BRIEF DESCRIPTION OF THE DRAWINGS

Exemplary embodiments of the inventive concept will be more clearly understood from the following detailed description taken in conjunction with the accompanying drawings in which.

DETAILED DESCRIPTION

Figure 1:
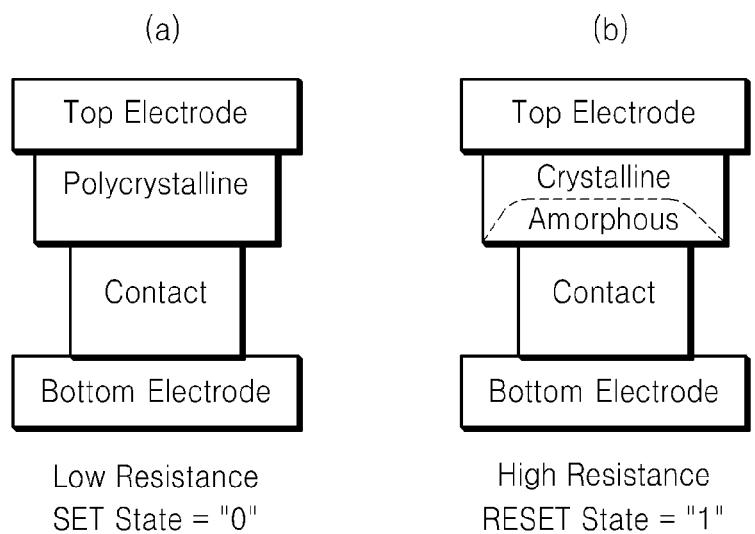
FIGS. 1a and 1b are related sectional views showing change in a phase change material as a function of programmed (or set/reset) states for a phase change random access memory (PRAM) as one example of a resistive memory cell.

The inventive concept now will be described more fully hereinafter with reference to the accompanying drawings in which illustrative embodiments of the inventive concept are shown. This inventive concept may, however, be embodied in many different forms and should not be construed as being limited to only the illustrated embodiments. Rather, the embodiments are provided so that this disclosure will be thorough and complete, and will fully convey the scope of the inventive concept to those of ordinary skill in the art.

It will be understood that when an element or layer is referred to as being "on" another element or layer, the element or layer can be directly on another element or layer or intervening elements or layers. In contrast, when an element is referred to as being "directly on" another element or layer, there are no intervening elements or layers present. As used herein, the term "and/or" includes any and all combinations of one or more of the associated listed items.

It will be understood that, although the terms first, second, third, etc., may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the inventive concept.

The terminology used herein is for the purpose of describing particular embodiments only and is not intended to be limiting of the inventive concept. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Throughout the written description and drawings like reference numbers and labels are used to denote like or similar elements.

While a dynamic random access memory (DRAM) and a flash memory store binary (or multi-bit) data in relation to electrical charge, the magnetic RAM (MRAM) and phase change RAM (PRAM) store binary (or multi-bit) data using respective mechanisms that vary the electrical resistance of a memory cell. One important performance characteristic for all types of non-volatile memory is data storage period. This characteristic may be expressed as a period of time during which stored data may be retained within a memory cell, and/or an endurance level that indicates a permissible number of normal operations that may be executed in relation to a memory cell until its becomes "worn".

The endurance level of a MRAM generally ranges from about $10^{12}$ to $10^{15}$ which is not yet the equal to a DRAM. However, since the MRAM stores data in relation to variations in resistance, it is highly resistant to the ill-effects of radiation. Therefore, the MRAM is presently considered an excellent choice for use in certain aerospace and military applications.

FIGS. 1a and 1b are related sectional views showing that the characteristic of a phase change material varies based on set states in a PRAM which is one example of a resistive memory.

As shown in FIGS. 1a and 1b, a PRAM generally comprises a top electrode and bottom electrode sandwiching a bitline contact and a thin-film of phase change material (e.g., GeSbTe or GST). The GST thin-film may be switched between an amorphous state and a crystalline state according to an applied temperature, where these respective states exhibit differing resistances. This mechanism makes it possible to distinguish, for example, a SET state (or logical "0") shown in FIG. 1(a) and a RESET state (or logical "1") shown in FIG. 1(b).

Figure 2:
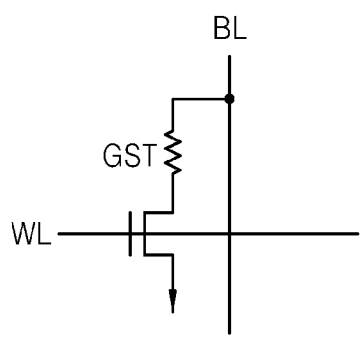
FIG. 2 is an equivalent circuit diagram for a unit cell of a PRAM.

FIG. 2 is an equivalent circuit diagram for a unit cell of a PRAM. A wordline WL is connected to the gate of a switching transistor within one cell, whereas a bitline BL is connected to the drain node of the switching transistor, where a GST material is interposed between the bitline BL and the drain node of the switching transistor. It is necessary to apply a heat exceeding a critical temperature to the GST material to change the phase of the PRAM, and applying a voltage to a resistive electrode generates the heat. At this point, the particular portion of the GST material to which the heat is directly applied becomes amorphous, and the remaining portion of the GST material is crystallized and thus the PRAM exhibits a relatively high resistance.

Figure 3:
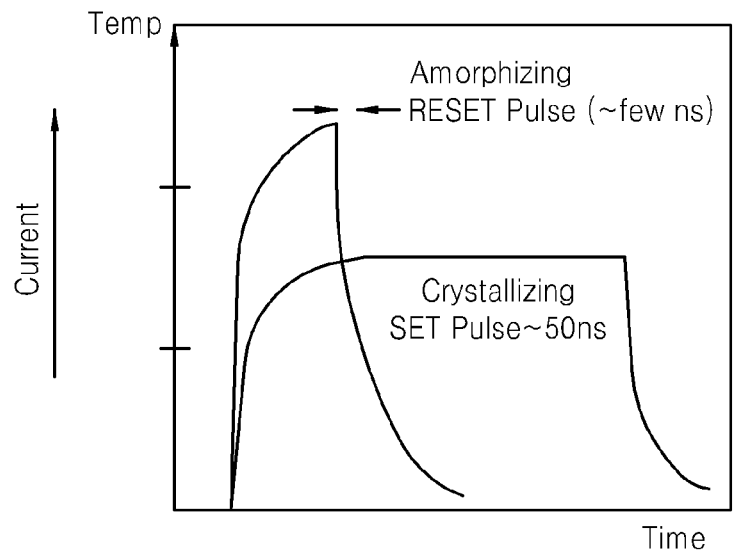
FIG. 3 is a graph showing current pulses applied when binary data is stored in a PRAM.

FIG. 3 is a graph showing exemplary current pulses applied when binary data is stored in a PRAM. In FIG. 3, the x-axis indicates time periods and the y-axis indicates temperature. When binary data is stored, a set pulse is used to change the state of a chalcogenide thin-film, which is a GST material, to a crystalline state, and the set pulse has a width below 50 ns at a temperature above a suitable temperature for the GST material to be crystallized. A reset pulse is a pulse for changing the state of the chalcogenide thin-film to an amorphous state, and a width of the reset pulse is smaller than that of the set pulse, or about several ns. The pulse is for applying heat above a temperature for melting a material to amorphous state.

Figure 4:
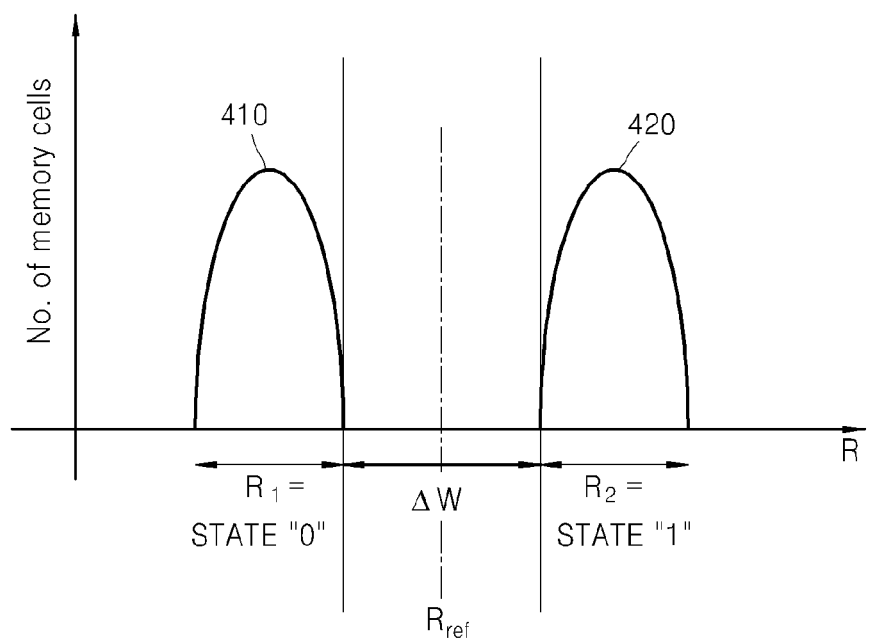
FIG. 4 is a diagram showing resistance distributions for a memory cell in a resistive memory.

FIG. 4 is a diagram showing resistance distributions for a memory cell in a resistive memory.

As shown in FIG. 4, a reference resistance (Rref) is located between a first distribution region R1 indicating a RESET state "1" 410 and a second distribution region R2 indicating a SET state "0" 420. Referring to FIG. 4, the reference resistance Rref is defined to secure a sufficient read margin (ΔW) between the respective and non-overlapping distribution regions. With this sufficient margin, a sense amplifier (not shown) may accurately distinguish between the respective distributions and detect the programmed state of a target resistive memory cell during a read operation.

It is generally understood that the resistance of a resistive memory cell will decrease as the memory cell becomes worn (i.e., subjected to a great number of read/write operations approaching or exceeding its endurance level). As the resistance of a worn memory cell decreases the read margin shrinks and it becomes difficult (and sometimes impossible) to discriminate between distribution region R1 and distribution region R2 to accurately detect whether the target memory cell is programmed to a set state (0) or reset state (1).

Figure 5:
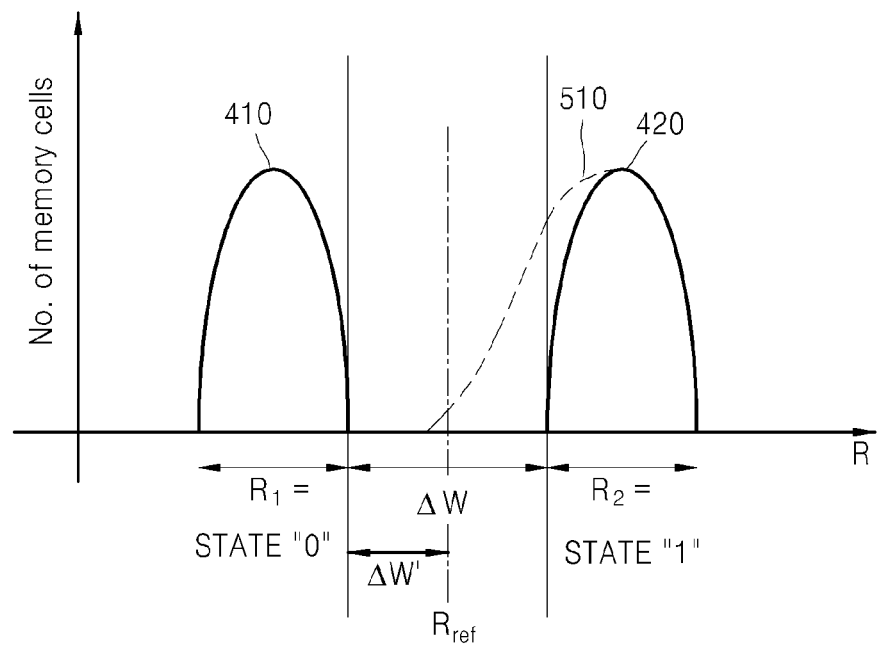
FIG. 5 is a diagram comparatively showing resistance distributions for a worn memory cell and related resistance decreases.

FIG. 5 is a diagram comparatively illustrating this phenomenon in relation to the ideal arrangement of resistance distributions shown in FIG. 4. That is, FIG. 5 shows resistance distributions for a worn memory cell.

In FIG. 5, the reset resistance distribution R2 510 for the worn memory cell exhibits a certain amount of "spreading" characterized by decreased resistance when compared to the ideal distribution R2 420. As a result, the expected (or ideal) read margin $\Delta W$ separating the set resistance R1 and the reset resistance R2 decreases to $\Delta W'$. Therefore, the set state and the reset state of the worn memory cell cannot be clearly distinguished and the reliability of the resistive memory is deteriorated. In sum, sufficient read margin cannot be secured by the worn memory cell resistance distribution region 510 which in extreme circumstances may partially overlap by the set resistance distribution 410.

Figure 6:
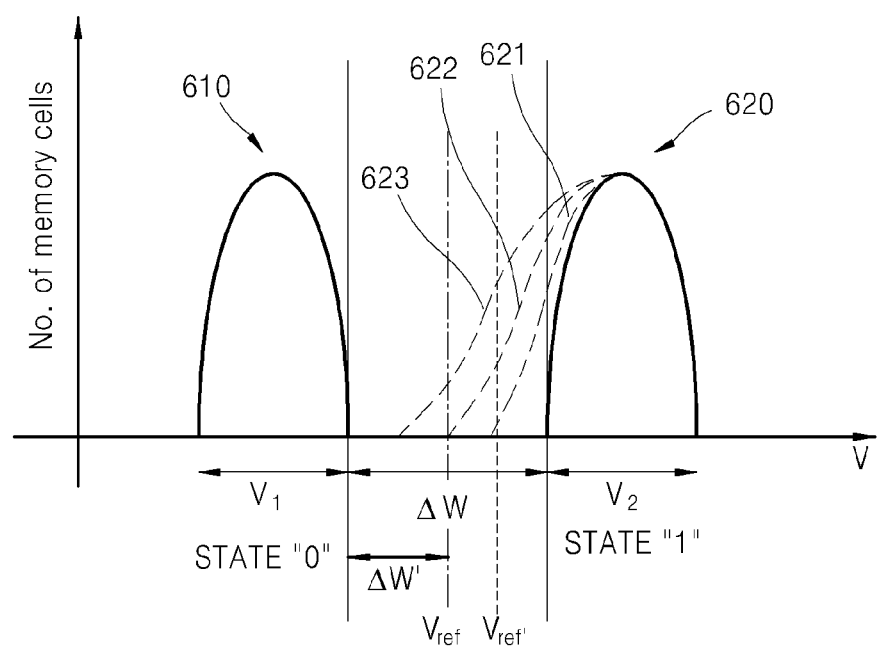
FIG. 6 is a diagram illustrating an approach that uses mode changes to detect a worn memory cell according to an embodiment of the inventive concept.

FIG. 6 is a different type of distribution diagram (voltage "V" verses resistance "R") showing an approach, consistent with an embodiment of the inventive concept, wherein certain mode changes may be used to detect a worn memory cell in accordance with its expanded resistance distribution.

Referring to FIG. 6, the voltage distribution diagram, wherein respective voltage distributions are correlated to the former resistance distributions, may be obtained, for example, by monitoring the voltage of the bitline shown of FIG. 2, such that variations in resistance is proportional to the voltage of the bitline. Like FIG. 4, FIG. 6 shows a first voltage distribution V1 610 corresponding to the set voltage state ("0"), and a second voltage distribution V2 620 corresponding to the reset voltage state ("1"), wherein the first and second voltage distributions are associated with normal memory cell operation. Under these model conditions, a full read margin $\Delta W$ may be secured between the first and second voltage distributions V1 and V2. However, as the memory cell increasingly becomes worn, its higher resistance state (i.e., the RESET resistance state corresponding to the second voltage distribution V2) begins to degrade and gradually decreases in resistance. In effect, the resulting resistance distribution expansion causes a corresponding spreading of the second voltage distribution (e.g., from the initial second voltage distribution 620, to an expanded second voltage distribution 621, to a further expanded second voltage distribution 622, to a still further expanded second voltage distribution 623). Under one or more of these worn memory cell conditions (621, 622, 623), when a corresponding sense amplifier establishes an initial reference voltage Vref assuming a full read margin $\Delta W$, the sense amplifier may not be able to accurately detect the programmed resistance state for a worn target memory cell.

According to an embodiment of the inventive concept, if the reference voltage used to detect the programmed resistance state for a target memory cell (i.e., discriminate between adjacent voltage distributions corresponding to adjacent resistance distributions) is effectively adjusted from an initial reference voltage Vref to an adjusted (higher) reference voltage Vref' by changing the mode of operation for the sense amplifier, the programmed resistance state of the target memory cell may be accurately determined even where the target memory cell is significantly but not completely worn.

That is, if the reference voltage established by operation of the sense amplifier is adjusted upward in voltage level to adjusted (or higher) reference voltage Vref' as shown in FIG. 6, both the expanded second voltage distribution 621 and further expanded second voltage distribution 622 may be accurately discriminated from the first voltage distribution V1, despite the relatively worn condition of the target memory cell. Only when the second voltage distribution reaches the condition of the still further expanded second voltage distribution 623 is the adjusted reference voltage incapable of discriminating adjacent first and second voltage distributions (i.e., a completely worn memory cell condition). Thus, fully internal control adjustments made to the sense amplifier may be used to accurately detect the programmed state of significantly worn memory cells.

Figure 7:
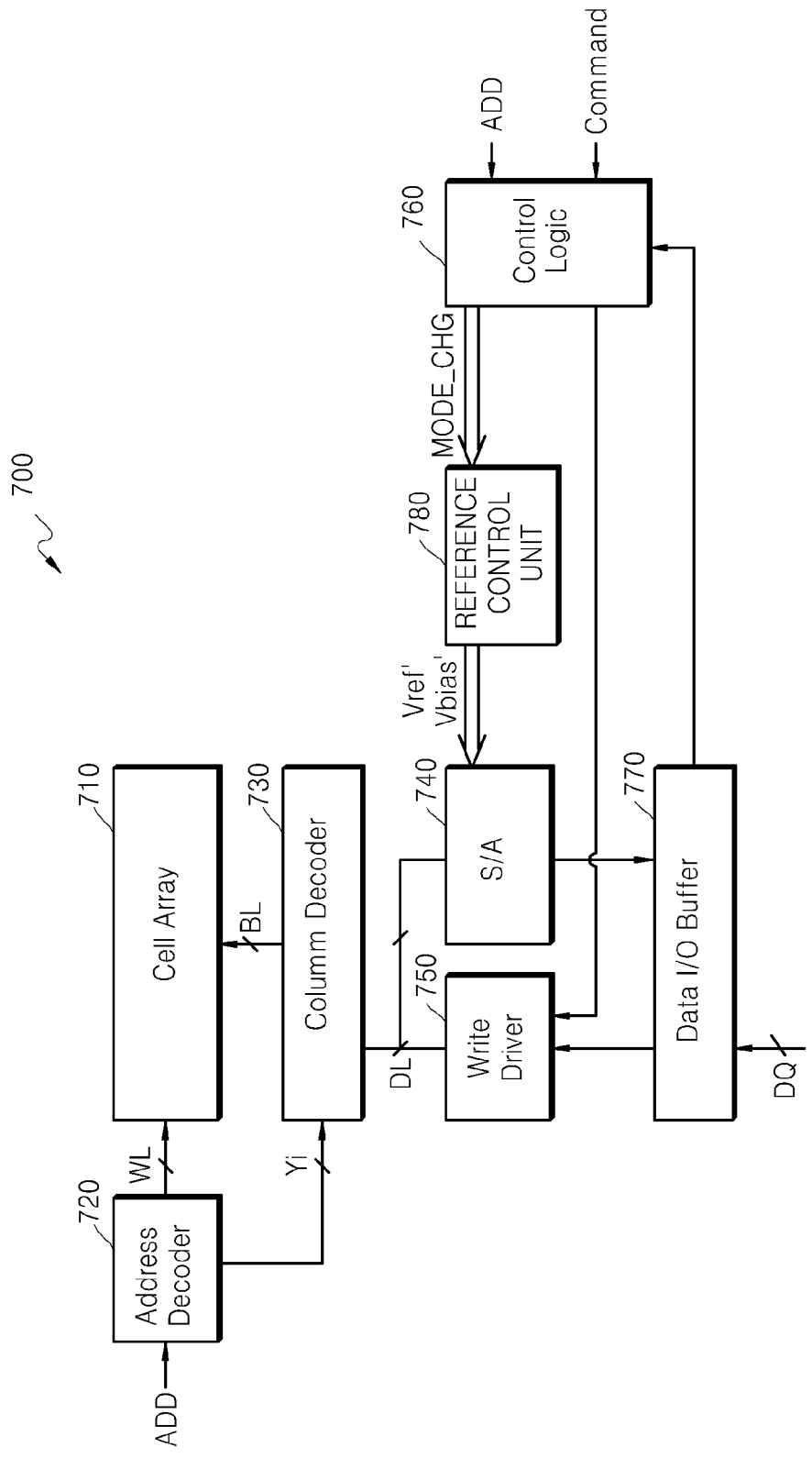
FIG. 7 is a block diagram of a resistive memory device according to an embodiment of the inventive concept.

FIG. 7 is a block diagram of a resistive memory device according to an embodiment of the inventive concept.

Referring to FIG. 7, a cell array 710 of a phase change memory device 700 according to the inventive concept includes a plurality of memory cells which are arranged in rows (or as wordlines—WLs) and columns (or as bitlines—BLs). Each of the memory cells includes a switching device and a resistive component. The switching device may be formed of any of various devices, such as a metal-oxide semiconductor (MOS) transistor, a diode, or the like. The resistive device is formed of a phase change material containing the GST material as described above.

An address decoder 720 decodes an externally provided input address (ADD). Here, the address is assumed to include a row address and a column address. The address decoder 720 selects a wordline WL according to the row address and selects a bitline BL according to the column address. Here, the address decoder 720 provides a column selecting signal (Yi) to a column decoder 730.

The column decoder 730 is connected to the memory cell array 710 via the bitline BL and is connected to a writer driver 750 via a dataline (DL). In response to a column selecting signal Yi, the column decoder 730 electrically connects a dataline and a selected bitline. The write driver 750 provides a write current for writing data to a selected memory cell.

A sense amplifier 740 includes a sense amplifier for detecting whether data is written to a memory cell or not and a sense amplifier for detecting data, which is written to a memory cell via a bitline selected by the column decoder 730, during a data reading operation.

Via a data input/output (I/O) buffer 770 an externally provided input data (DQ) is applied to the write driver 750. Furthermore, the data I/O buffer 770 may provide information indicating the degree of wear for one or more memory cells in memory cell array 710 to a control logic 760 during a power-ON or an initialization routine for the phase change memory device 700. This "wear information" indicates a degree of wear for the memory cell(s) and may be separately stored as bitmap data. Furthermore, the wear information may be stored as descriptor information to be referred to by constituent operating software.

The control logic 760 manages worn memory cells. When a worn memory cell management command and an address ADD are received, the control logic 760 may check the level of wear for the entire memory cell array (or a portion thereof) prior to executing a write operation. First, the control logic 760 transmits a mode change signal (MODE_CHG) that switches the read mode of the phase change memory device 700 from a normal read mode to a worn memory cell detecting mode (or error detecting mode) to a reference control unit 780. In response, the reference control unit 780 provides either an adjusted reference voltage signal (Vref' or Vbias') to change the reference point (or voltage) for detecting the resistance of a phase change material. The sense amplifier 740 then performs a read operation using the output signal.

A memory system according to an embodiment of the inventive concept may determine whether the current resistance exhibited by memory cell(s) is allowable upon reading respective voltages from bitlines of a memory cell array. As described above with reference to FIG. 6, the memory system may adjust or shift upward a constituent reference voltage (Vref) towards the reset voltage direction to better discriminate adjacent voltage distributions. Increasing current by applying a bias voltage may also be an example of resistance detection for a worn memory cell in a defined detection mode.

A memory system according to an embodiment of the inventive concept may check the degree of wear for one or more memory cell(s), and then, if the memory cell(s) are determined to be worn, update the wear information corresponding to the worn memory cell(s).

In a memory system according to an embodiment of the inventive concept, the system may switch between a normal read mode and a worn memory cell detecting mode either before or after write data is written to the memory cell(s). Alternatively, the memory system may periodically check worn memory cells according to a timing operation while a memory device is operating or, in the case of a special event, may check worn memory cells in synchronization with the occurrence of the event.

Figure 8:
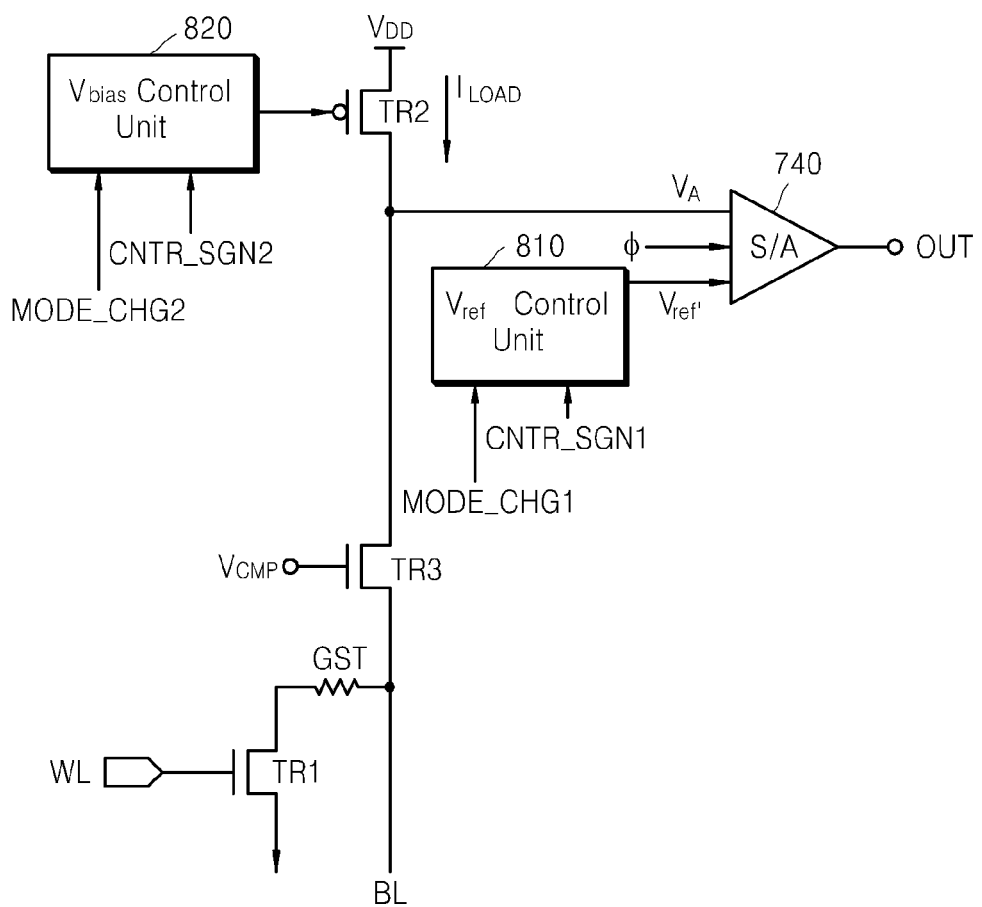
FIG. 8 is a diagram illustrating the operation of a sense amplifier in relation to a peripheral circuit according to an embodiment of the inventive concept.
Figure 9A:
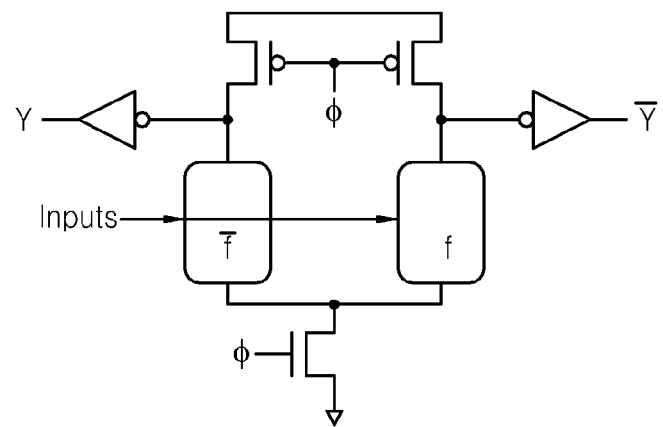
FIGS. 9A through 9G respectively illustrate various types of sense amplifiers that may be incorporated within embodiments of the inventive concept.
Figure 9B:
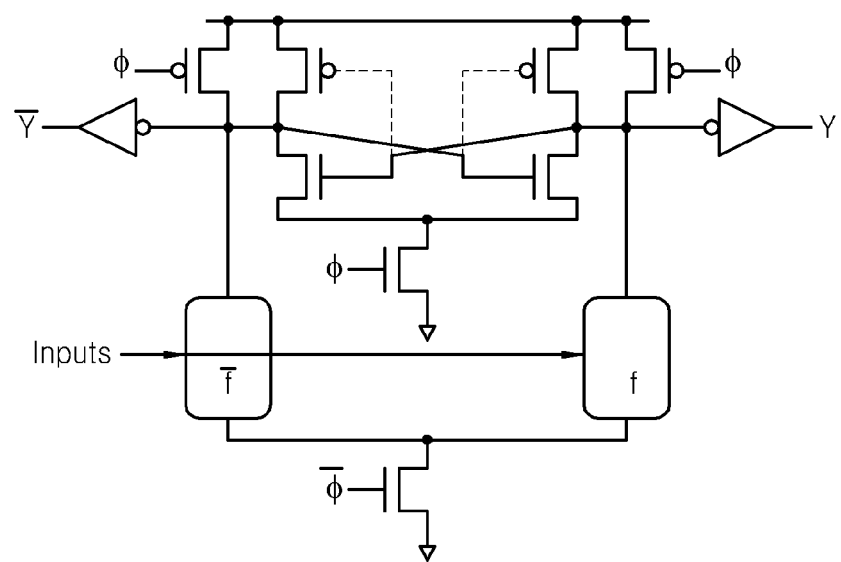
Figure 9C:
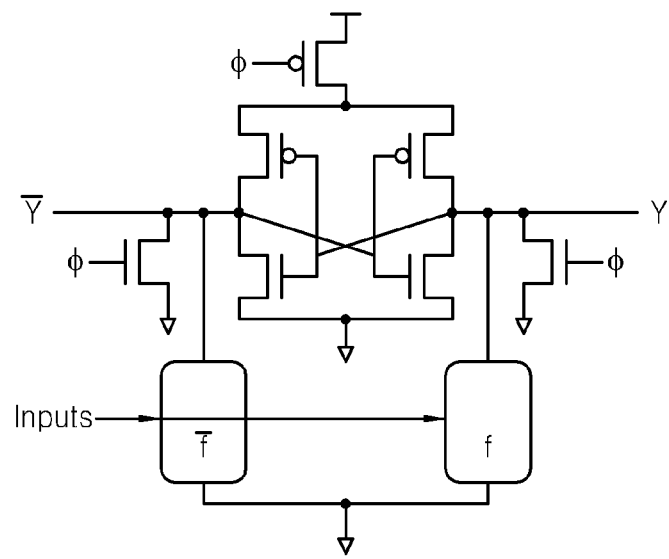
Figure 9D:
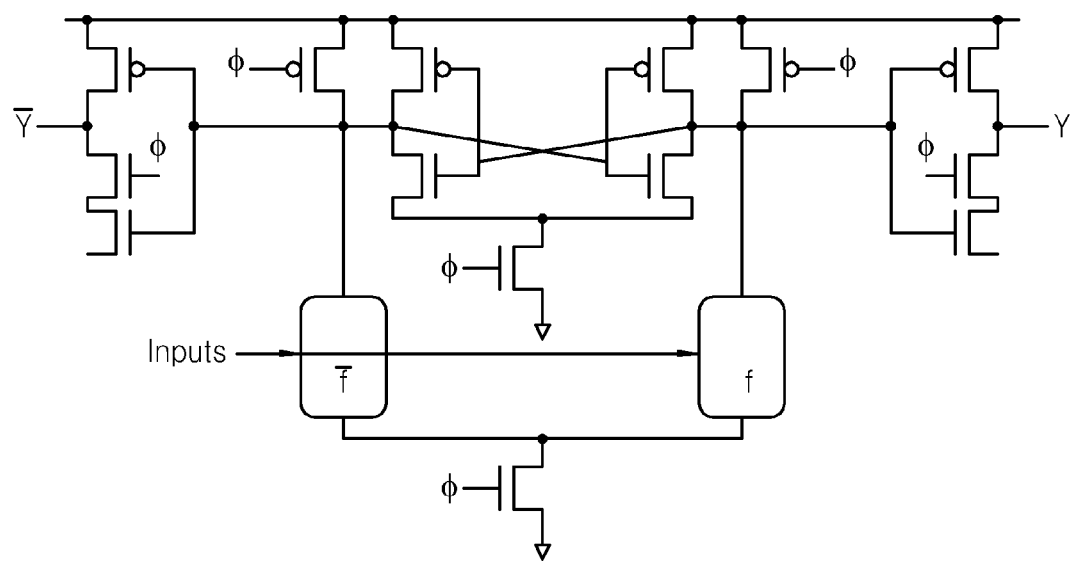
Figure 9E:
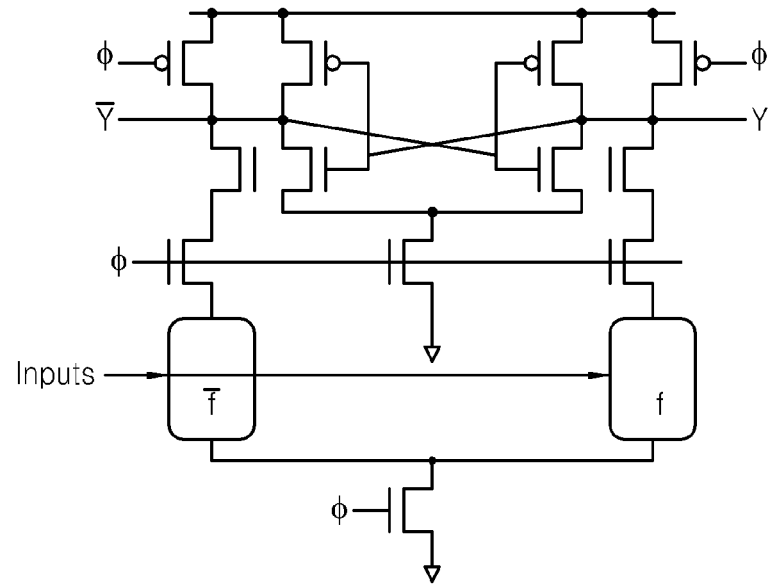
Figure 9F:
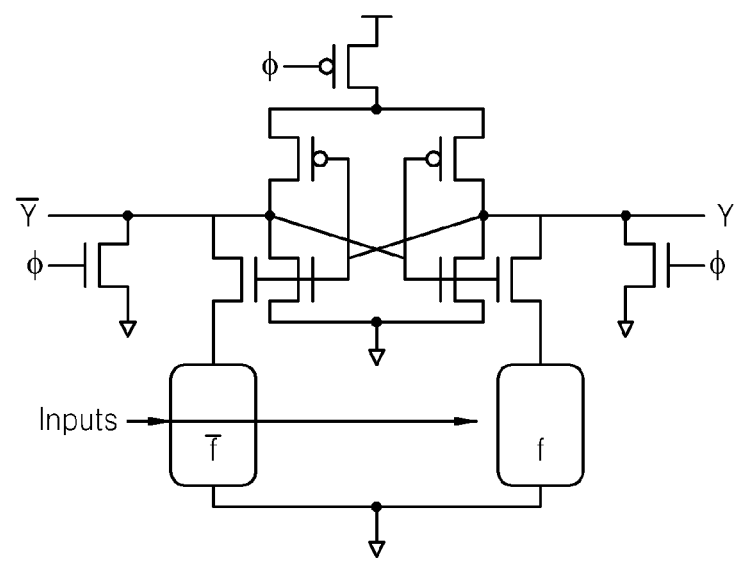
Figure 9G:
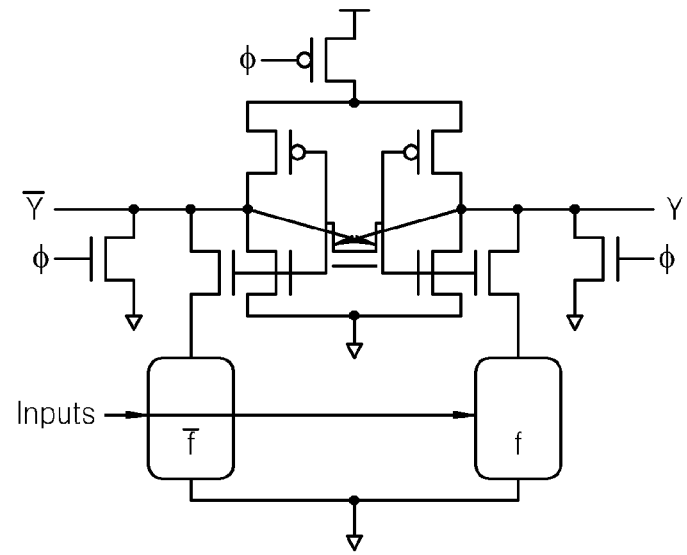

FIG. 8 is a diagram showing further illustrating sense amplifier 740 in an operative relationship with a peripheral circuit according to an embodiment of the inventive concept.

The power source of the entire circuit is VDD, and a load current $I_{LOAD}$ flows via a power TR2. A cell transistor TR1 is controlled based on a wordline WL signal, and is connected to a bitline BL via a GST.

Either a bias voltage is adjusted by a bias voltage control unit 820 or a reference voltage is adjusted by a reference voltage control unit 810 in the sense amplifier 740. The indicated signal Φ is a control signal used to turn ON/OFF the sense amplifier 740, and $V_A$ is a voltage input to the sense amplifier 740.

When a first mode change signal (MODE_CHG1) indicating a mode change and a corresponding control signal for adjusting the reference voltage are received by the reference voltage control unit 810, it changes the initial reference voltage Vref (e.g., like the one shown in FIG. 6) to an adjusted reference voltage Vref'. The adjustment of the reference voltage is not limited to boosting a reference voltage and should be understood as making an adjustment to a reference point for detecting the reset resistance.

When the reference voltage is adjusted, a corresponding detection reference point at which the resistance of a memory cell is detected is changed, and the detection reference point is shifted toward the reset resistance. The degree of wear for a memory cell may be detected in advance by detecting the resistance in accordance with the adjusted detection reference point.

The same effect may be obtained by adjusting a bias voltage. When a second mode change signal (MODE_CHG2) indicating a mode change and a corresponding control signal (CNTR_SGN2) for adjusting a bias voltage are received at the bias voltage control unit 820, it outputs an adjusted bias voltage Vbias' instead of the initial bias voltage Vbias applied to the power transistor T2 of FIG. 8.

FIGS. 9A through 9G show various types of sense amplifiers that might be incorporated into embodiments of the inventive concept. In FIGS. 9A through 9G, element "f" indicates an input to the sense amplifier. The input f may be the adjusted reference voltage Vref' which is the output of the reference voltage control unit 810, a normal input voltage $V_A$, or an adjusted input voltage $V_A$ as determined by the bias voltage control unit 820. These inputs may have different (e.g., opposite) phases and are thus indicated as inputs f and /f. Outputs Y and /Y are adjusted by the input f. Compared to FIG. 8, each of the inputs f and /f correspond to Vref' or the input voltage $V_A$ provided by power transistor TR2, which is controlled by the applied bias voltage Vbias.

The output OUT shown in FIG. 8 is generated when a sense amplifier is enabled by the control signal Φ. Since the two inputs described above have opposite phases, a user may use either or both of the inputs as required.

Detailed descriptions on the sense amplifiers shown in FIGS. 9A through 9G will be omitted as those of ordinary skill in the art are readily able to understand the nature and operation of the various sense amplifier examples provided.

FIGS. 10A through 10F are circuit diagrams showing the change of a point for generating a reference voltage and a point for detecting resistance according to an embodiment of the inventive concept. The illustrated embodiment is directed to a voltage adjustment for adjusting a reference voltage or a bias voltage.

Figure 10A:
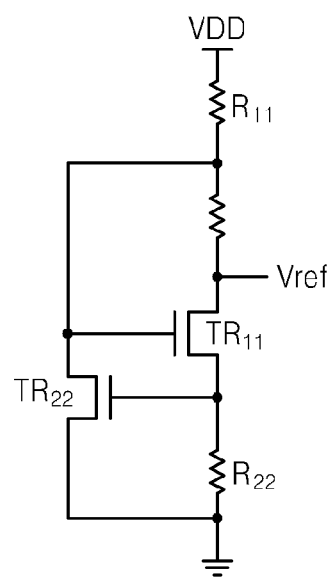
FIGS. 10A through 10F are circuit diagrams respectively illustrating an approach that changes a point for generating a reference voltage and a point for detecting resistance according to embodiments of the inventive concept.

First, FIG. 10A is a circuit diagram showing one approach to the generation of a reference voltage (Vref). The reference voltage Vref is generated from an applied power voltage VDD using transistors TR11 and TR22 and two resistors R11 and R22 in the arrangement shown. Those skilled in the art will recognize, however, that this is merely one example of many different ways that the reference voltage may be generated.

FIGS. 10B through 10F are circuit diagrams respectively illustrating how a second voltage $V_2$ may be generated from an applied first voltage $V_1$. During the process of detecting a resistance for a resistive memory cell, either the reference voltage Vref or the bias voltage Vbias may be adjusted to effectively change a reference point for detecting the resistance of the memory cell as described above. Thus, in the context of FIGS. 10B through 10F, the initial reference voltage Vref applied during normal read operations may be seen as the first voltage $V_1$ and the adjusted reference voltage Vref' may be seen as the resulting second voltage $V_2$. Similarly, the initial bias voltage Vbias applied during normal read operations may be seen as the first voltage $V_1$ and the adjusted bias voltage Vbias' may be seen as the resulting second voltage $V_2$.

Figure 10B:
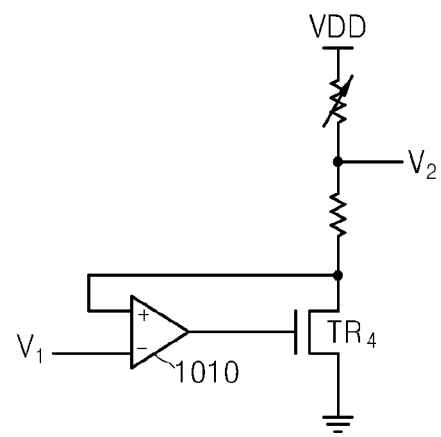

As shown in FIG. 10B, when the first voltage $V_1$ is output via a comparator 1010, the second voltage $V_2$ may be divided from a connected resistor, where the output of the comparator 1010 controls the operation of transistor TR4. FIG. 10B shows a structure in which the transistor TR4 bis turned ON so that the second voltage $V_2$ may be output. Resistance is changed using a digital code to control the magnitude of voltage to be used as is well understood by those skilled in the art. The digital code may be a control logic. Since the digital code is used, the circuit may produce discrete variable resistance outputs. Power voltage VDD is divided by a resistor as changed by the applied digital code and the connected resistor, and the second voltage $V_2$ is output in accordance with this voltage division.

Figure 10C:
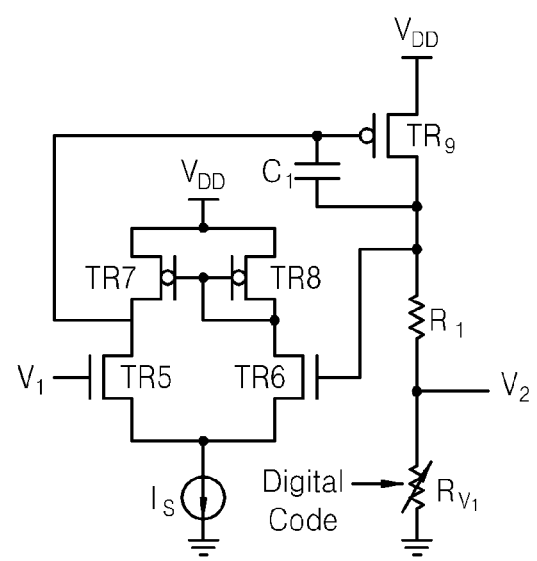

FIG. 10C shows a circuit using a buffer consisting of transistors TR5 through TR8 and a current source Is. When transistor TR9 is turned ON by charging capacitor C1, the power voltage VDD is divided between resistor R1 and variable resistor Rv1 to generate the second voltage $V_2$. The first voltage controls the operation of transistor TR5.m. Further, like the embodiment shown in FIG. 10B, the value of the variable resistor Rv1 may be changed using an applied digital code.

Figure 10D:
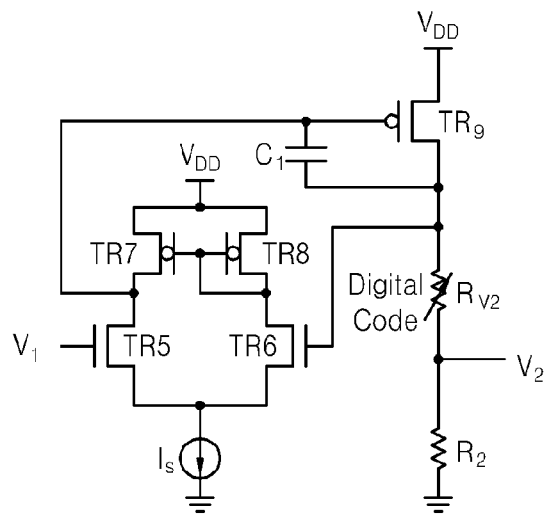

FIG. 10D shows another circuit identical to the circuit of in FIG. 10C, except that the positions of the resistor and variable resistor have been switched.

Figure 10E:
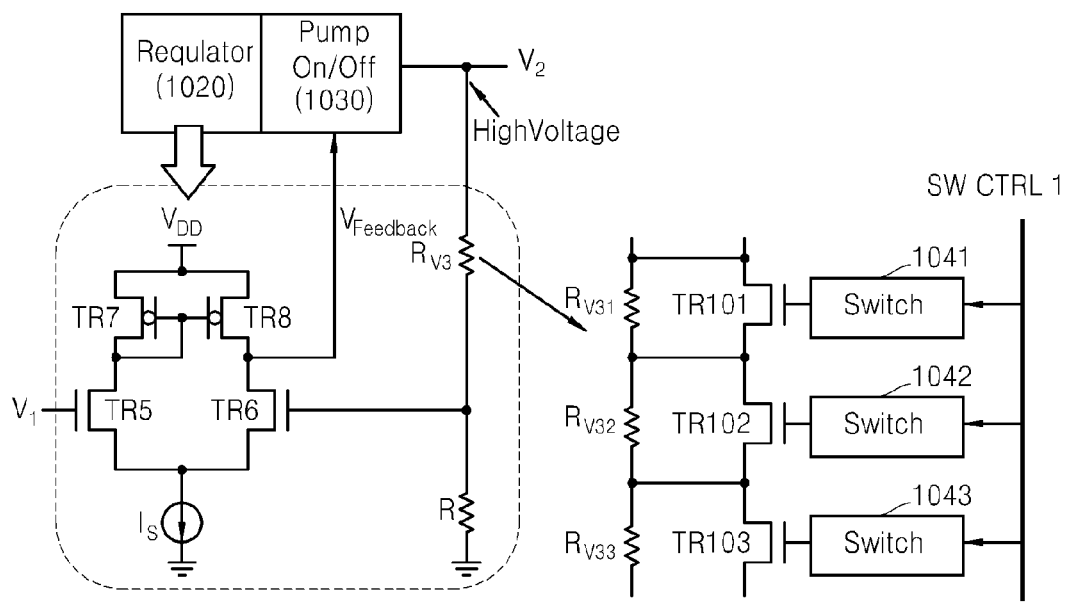

FIG. 10E shows yet another circuit that may be used to ensure that the second voltage V2 is increased in level over than of the first voltage V1. As described above, a detection reference point may be changed in a mode for detecting the resistance of a cell, a reference voltage may be lowered for changing the reference point, or a reference voltage may have to be raised (e.g. when polarities are opposite). To raise a reference voltage, a voltage is boosted by using a charge pump 1030. The voltage is adjusted by a regulator 1020, and the charge pump 1030, to which a voltage $V_{Feedback}$ is input, outputs a raised voltage and generates a high voltage V2 higher than the input voltage. FIG. 10E shows an example in which a switch is used instead of a digital code to adjust a variable resistor Rv3.

Variable resistor Rv3 may include first variable Rv31, second variable Rv32, and third variable Rv33, which are connected in series, and the resistance value of each resistor is varied by connected transistors TR101, TR102, and TR103 which are turned ON/OFF under the control of the first through third switches 1041, 1042, and 1043. In other words, if all of the first through third switches 1041, 1042, and 1043 are closed, the resistance becomes zero. For example, if only the first and third switches are closed, the variable resistor Rv3 is equal to the second variable resistor Rv32. The first through third switches 1041, 1042, and 1043 may be controlled by a switch control signal SW CTRL 1.

Figure 10F:
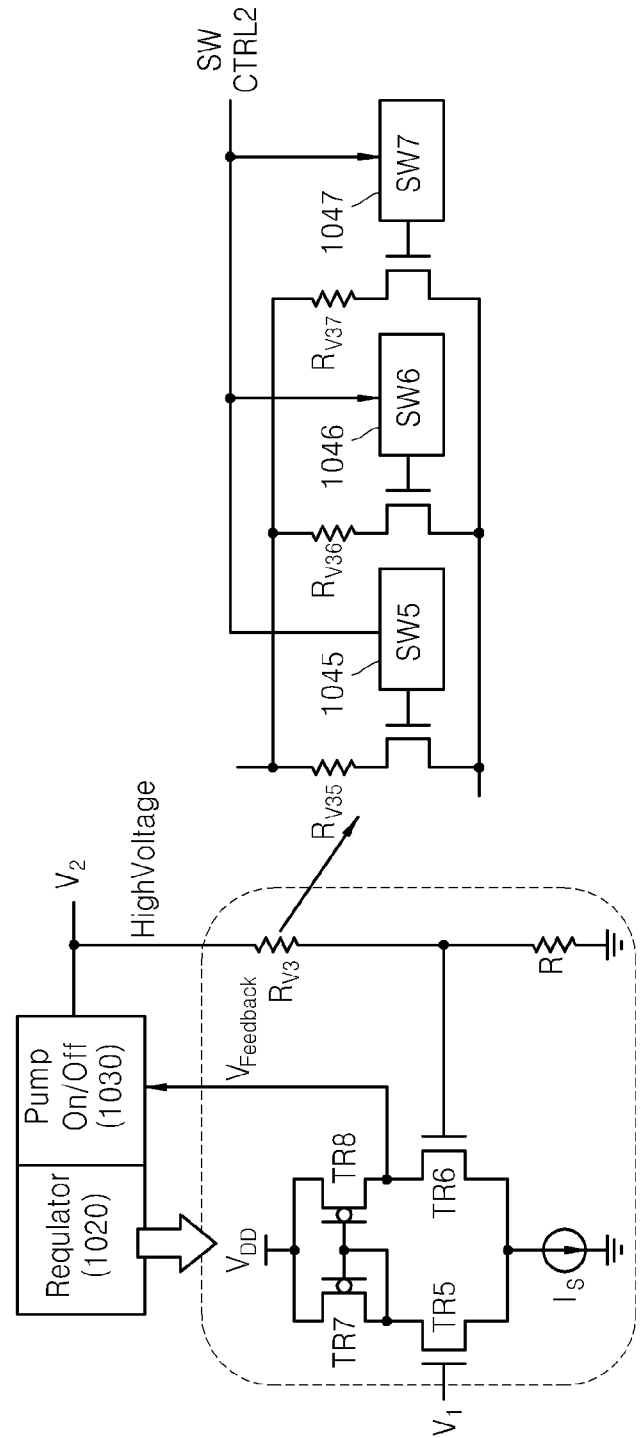

FIG. 10F shows yet another circuit which, like the circuit of FIG. 10E, adjusts the resistance of a variable resistor Rv3 may by selectively including one or more of first through third variable resistors Rv35, Rv36, and Rv37, however, the first through third variable resistors are arranged in parallel instead of being series connected. First through third switches 1045, 1046, and 1047 may be controlled by a switch control signal SW CTRL 2. If all of the switches 1045, 1046, and 1047 are closed, the resistance is the smallest resistance due to the parallel connection of Rv35, Rv36, and Rv37. If only the sixth switch is closed, then the variable resistor Rv3 will be equal to the second variable resistor Rv36.

Figure 11:
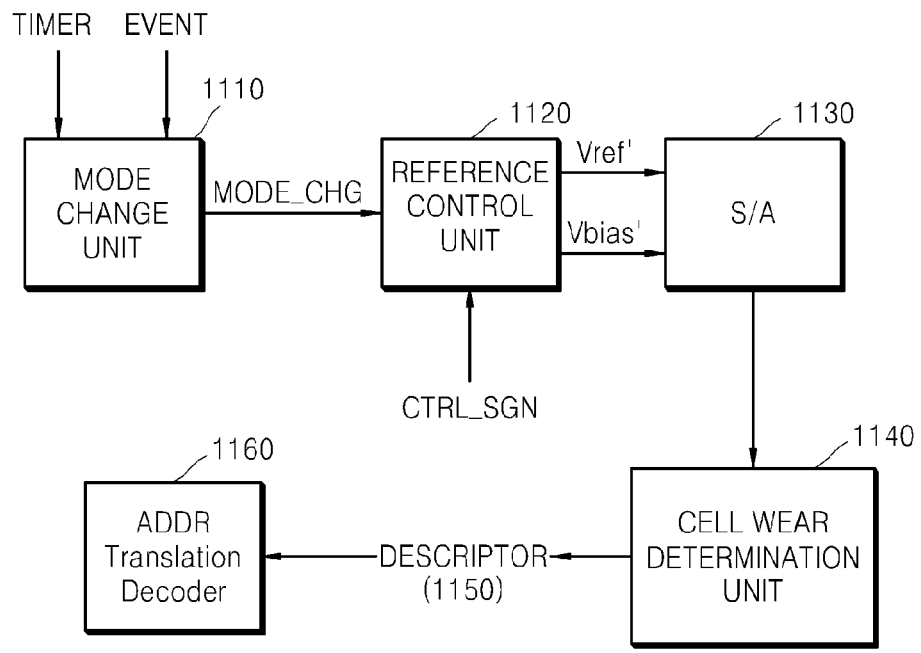
FIG. 11 is a block diagram of a worn cell management apparatus according to an embodiment of the inventive concept.

FIG. 11 is a block diagram of a worn memory cell management apparatus according to an embodiment of the inventive concept.

A mode changing unit 1110 generates a mode change signal (MODE_CHG) to detect the resistance of a resistive memory cell in response to a timer operation, detected event, etc. Normally, a sense amplifier 1130 operates in a normal read mode. However, by application of the mode change signal (MODE_CHG), the operation of the sense amplifier switches from normal read mode to a worn memory cell detecting mode capable of checking the degree of wear for resistive memory cells in relation to the operation of reference control unit 1120 providing either an adjusted reference voltage Vref' or an adjusted bias voltage Vbias'.

As previously noted, there may be various mode switching methods, e.g. a periodical mode change based on a timer input or a mode change due to a special event. For example, an event for checking wear in the case where a memory is read or programmed more than a predetermined number of times may occur. After such an event, the number of times a memory is read or programmed is reset.

When a worn memory cell detecting mode signal is transmitted to the reference control unit 1120, it is necessary to check whether or not the resistance of a memory cell has decreased. As described above, if the reset voltage decreases, the boundary between the set state and the reset state may become unclear, and thus it is necessary to check wear of memory cells in advance. Therefore, a resistance detection reference point is changed. The resistance detection reference point may be changed by adjusting a reference voltage Vref or a bias voltage Vbias, which is a voltage input to a sense amplifier, as described above. To change the resistance detection reference point, an adjusted reference voltage Vref' or an adjusted bias voltage Vbias' is applied to the sense amplifier 1130.

In FIG. 11, a bias voltage is actually applied to the circuit of a sense amplifier, that is, it may be considered that the bias voltage is an input to the sense amplifier 1130.

For the reference control unit 1120 to change a reference point, a control signal CTRL_SGN is applied.

The sense amplifier 1130 detects the resistance of a memory cell based on the changed detection reference point. Then, the detected resistance is used by a cell wear determining unit 1140 to determine whether or not a cell is worn or if the degree of wear for a memory cell exceeds a reference level. If the resistance has decreased and it is determined that a cell is worn, the memory cell wear determining unit 1140 stores information regarding the corresponding memory cell to a descriptor 1150 in advance, such that data is no longer written to the memory cell or data is less frequently written. The descriptor may be stored in the memory cell array.

An address conversion decoder 1160 performs logic address conversion with reference to the descriptor 1150, such that data is no longer written to a worn memory cell or the worn memory cell is accessed less frequently.

Figure 12:
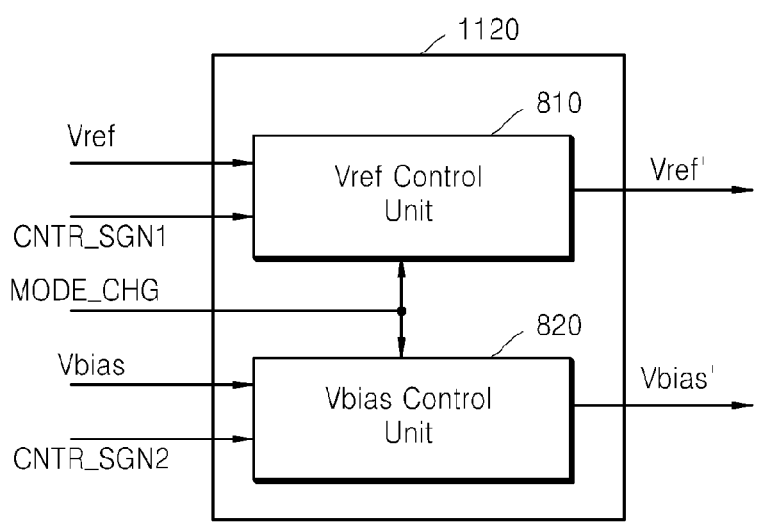
FIG. 12 is a block diagram of a reference control unit in a worn cell management apparatus according to an embodiment of the inventive concept.

FIG. 12 is a block diagram of a reference control unit in a worn memory cell management apparatus according to an embodiment of the inventive concept.

The reference control unit 1120 includes a reference voltage control unit 810 and a bias voltage control unit 820. The reference voltage control unit 810 receives a reference voltage Vref and a first control signal (CNTR_SGN 1) and outputs an adjusted reference voltage Vref' for changing a resistance detection reference point for detecting worn memory cells.

The bias voltage control unit 820 receives a bias voltage Vbias and a second control signal (CNTR_SGN 2) and outputs an adjusted bias voltage Vbias' for changing a resistance detection reference point for detecting worn memory cells. In both of the cases above, a mode change signal (MODE_CHG) is applied.

Figure 13:
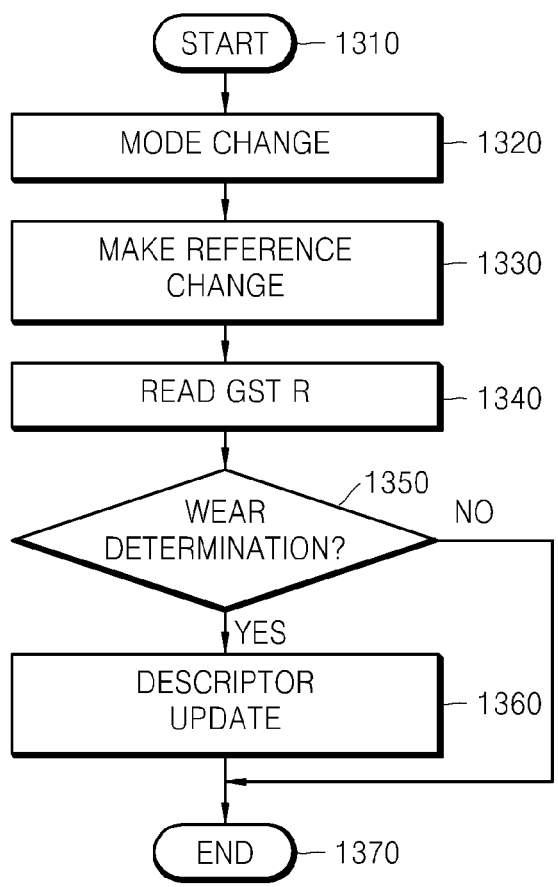
FIG. 13 is a flowchart summarizing a method of detecting worn cells according to an embodiment of the inventive concept.

FIG. 13 is a flowchart summarizing a method of detecting worn memory cells according to an embodiment of the inventive concept.

First, a mode is changed for determining worn resistive memory cells in advance (1320). In other words, the operating mode is switched from a normal read mode to a worn memory cell detecting mode.

The memory system changes a reference point at which the resistance of a cell is detected (1330). The reference point may be changed by adjusting either a reference voltage Vref or a bias voltage Vbias, as described above. The memory system now detects the programmed state (by a corresponding resistance) of the memory cell at the changed reference point (1340). The memory system determines whether or not the detected resistance has decreased below a wear reference level (1340). If yes, the corresponding descriptor information is updated (1360). The memory system with the updated descriptor may determine memory cells with decreased resistances with reference to the updated descriptor and may perform logic address conversion such that the cells with decreased resistances are no longer used.

While the inventive concept has been particularly shown and described with reference to exemplary embodiments thereof, it will be understood that various changes in form and details may be made therein without departing from the scope of the following claims.

What is claimed is:

1. A method of managing a resistive memory, the method comprising:
    switching from a normal read mode to a worn memory cell detecting mode upon detecting a decrease or increase in a resistance of a resistive memory cell in the resistive memory;
    detecting the resistance of the resistive memory cell when switching to the worn memory cell detecting mode using a first detection reference point;
    changing the first detection reference point to a second detection reference point when the detecting does not meet a predetermined condition;
    detecting the resistance of the resistive memory cell using the second detection reference point; and
    determining whether or not the resistive memory cell is worn by comparing the second detection reference point with a wear reference level when the detecting using the second detection reference point meet the predetermined condition.

2. The method of claim 1, wherein the predetermined condition is the number of cells.

3. The method of claim 1, wherein the changing of the first detection reference point to the second detection reference point comprises adjusting a reference voltage applied to a sense amplifier that detects a programming state of the resistive memory cell.

4. The method of claim 3, wherein a reference voltage applied to the sense amplifier corresponding to the second detection reference point is determined to be higher than a reference voltage applied to the sense amplifier corresponding to the first detection reference point.

5. A method of managing a resistive memory, the method comprising:
    switching from a normal read mode to a worn memory cell detecting mode upon detecting a decrease or increase in a resistance of a resistive memory cell in the resistive memory;
    detecting the resistance of the resistive memory cell when switching to the worn memory cell detecting mode using at least one detection reference point;
    determining whether or not the resistive memory cell is worn by comparing the least one detection reference point with a wear reference level; and
    changing a read condition in the normal read mode if the resistive memory cell is determined to be worn.

6. The method of claim 5, wherein the changing of the read condition in the normal read mode comprises managing an address conversion such that data is not written in the resistive memory cell that is determined to be worn.

7. The method of claim 5, wherein the changing of the read condition in the normal read mode comprises managing an address conversion such that the resistive memory cell that is determined to be worn is less frequently accessed.

8. The method of claim 5, wherein the at least one detection reference point is a reference voltage applied to a sense amplifier that detects a programming state of the resistive memory cell.

9. An apparatus for managing a resistive memory, the apparatus comprising:
    a mode change unit switching from a normal read mode to a worn memory cell detecting mode to determining a wear leveling state of a resistive memory cell;
    a reference control unit changing a detection reference point used to detect a resistance of the resistive memory cell in the worn memory cell detecting mode from a first detection reference point to a second detection reference point;
    a sense amplifier detecting the resistance of the resistive memory cell using the second detection reference point; and
    a cell wear leveling determination unit determining whether or not the resistive memory cell is worn by comparing the second detection reference point with a wear reference level when the detecting using the second detection reference point meets a predetermined condition.

10. The apparatus of claim 9, wherein the predetermined condition is the number of cells.

11. The apparatus of claim 9, wherein the first detection reference point and the second detection reference point are reference voltages applied to the sense amplifier that detects a programming state of the resistive memory cell.

12. The apparatus of claim 9, wherein the reference control unit changes the first detection reference point to the second detection reference point when the detecting using the first detection reference point does not meet the predetermined condition.

13. The apparatus of claim 12, wherein the reference control unit determines a reference voltage applied to the sense amplifier corresponding to the second detection reference point to be higher than a reference voltage applied to the sense amplifier corresponding to the first detection reference point.

14. The apparatus of claim 9, further comprising a descriptor storing information regarding the resistive memory cell that is determined to be worn by the cell wear leveling determination unit.

15. The apparatus of claim 14, further comprising an address translation decoder performing a logical address conversion such that data is not written or is less frequently written on the information regarding the resistive memory cell that is determined to be worn by using the information stored in the descriptor.

* * * * *